(12) United States Patent
Xu et al.

(10) Patent No.: US 7,350,164 B2
(45) Date of Patent: Mar. 25, 2008

(54) OPTIMIZATION AND DESIGN METHOD FOR CONFIGURABLE ANALOG CIRCUITS AND DEVICES

(75) Inventors: Yang Xu, Pittsburg, PA (US); Lawrence Pileggi, Pittsburgh, PA (US); Stephen P. Boyd, Stanford, PA (US)

(73) Assignees: Carnegie Mellon University, Pittsburgh, PA (US); The Board of Trustees for the Leland Stanford Junior University, Palo Alto, CA (US)

( * ) Notice: Subject to any disclaimer, the term of this patent is extended or adjusted under 35 U.S.C. 154(b) by 477 days.

(21) Appl. No.: 10/978,497

(22) Filed: Nov. 1, 2004

(65) Prior Publication Data
US 2005/0273732 A1    Dec. 8, 2005

Related U.S. Application Data

(60) Provisional application No. 60/577,360, filed on Jun. 4, 2004.

(51) Int. Cl.
*G06F 17/50* (2006.01)
(52) U.S. Cl. ............................................. 716/2; 716/1
(58) Field of Classification Search .................... 716/1, 716/2
See application file for complete search history.

(56) References Cited

U.S. PATENT DOCUMENTS

| | | | | |
|---|---|---|---|---|
| 4,827,428 | A * | 5/1989 | Dunlop et al. .................. | 716/6 |
| 6,269,277 | B1 * | 7/2001 | Hershenson et al. .......... | 700/97 |
| 6,864,822 | B2 * | 3/2005 | Gulati et al. ................. | 341/155 |
| 7,162,402 | B2 * | 1/2007 | Daems et al. .................. | 703/13 |
| 7,185,301 | B2 * | 2/2007 | Hao et al. ........................ | 716/8 |
| 2004/0172609 | A1 * | 9/2004 | Hassibi et al. ................. | 716/18 |
| 2006/0112355 | A1 * | 5/2006 | Pileggi et al. .................. | 716/1 |

OTHER PUBLICATIONS

Xu, et al., "ORACLE: Optimization with Recourse of Analog Circuits Including Layout Extraction," *DAC 2004*, Jun. 2004.
Hershenson et al., "Optimization of Inductor Circuits via Geometric Programming," *Proceedings for the 36th ACM/IEEE Conference on Design Automation (DAC '99)*, Jun. 1999.
Boyd et al., *Convex Optimization*, Cambridge University Press, New York, 2004.
Joseph Mitola III, *Software Radio Architecture: Object-Oriented Approaches to Wireless Systems Engineering*, John Wiley & Sons, New York 2000.
Liu et al., "Remembrance of Circuits Past: Macromodeling by data Mining in large Analog Design spaces," *IEEE DAC 2002*, Jun. 2002.

(Continued)

*Primary Examiner*—Jack Chang
*Assistant Examiner*—Magid Y. Dimyan
(74) *Attorney, Agent, or Firm*—Moore & Van Allen, PLLC; Steven B. Phillips

(57) ABSTRACT

Optimization design method for configurable analog circuits and devices resulting from same. An implementation fabric for a given application domain can be accurately pre-characterized in terms of devices and parasitics. Customization structures are designed and characterized to be applied to the fabric to customize a device for a particular application. In some embodiments, characterization is accomplished by formulating a configurable design problem as an optimization with recourse problem, for example, a geometric programming with recourse (GPR) problem. Devices can be produced for multiple applications from the application domain using the same optimized fabric to provide predictable performance.

36 Claims, 8 Drawing Sheets

OTHER PUBLICATIONS

Xu, et al., "Metal-mask Configurable RF Front-end Circuits," *2004 IEEE Radio Frequency Integrated Circuits Symposium*, Jun. 2004.

Nishikawa et al., "Three-Dimensional MMIC Technology for Low-Cost Millimeter-Wave MMICs," *IEEE Journal of Solid-State Circuits*, vol. 36, No. 9, Sep. 2001.

Karimi-Sanjaani et al., "A 2 GHz Merged CMOS LNA and Mixer for WCDMA," *Symposium on VLSI Circuits Dig. Tech. Papers*, Jun. 2001, pp. 19-22.

Shana'a et al., "Frequency-Scalable SiGe Bipolar RF Front-End Design," *IEEE Journal of Solid-State Circuits*, vol. 36, No. 6, Jun. 2001.

Gulati et al., "A Low-Power Reconfigurable Analog-to-Digital Converter," *IEEE International Solid-State Circuits Conference Dig. Tech. Papers*, Feb. 2001 pp. 54-55.

Hershenson et al., "Optimal Design of a CMOS Op-Amp via Geometric Programming," *IEEE Transactions on Computer Aided Design of Integrated Circuits and Systems*, vol. 20, No. 1, Jan. 2001.

Kamogawa, et al., "New Methodology for Microwave/Millimeter-wave MMIC Development," THIF-34, pp. 1913-1916, Sep. 2001.

Petty et al., "A 5.75b 350MSampel/s or 6.75b 150 MSample/s Reconfigurable Flash ADC for a PRML Read Channel," *IEEE Solid State Circuits Conference Dig. Tech. Papers*, Feb. 1998, pp. 148-149.

Yue et al., "On-Chip Spiral Inductors with Patterned Ground Shields for Si-Based RF IC's," *IEEE Journal of Solid-State Circuits*, vol. 33, No. 5 May 1998.

\* cited by examiner

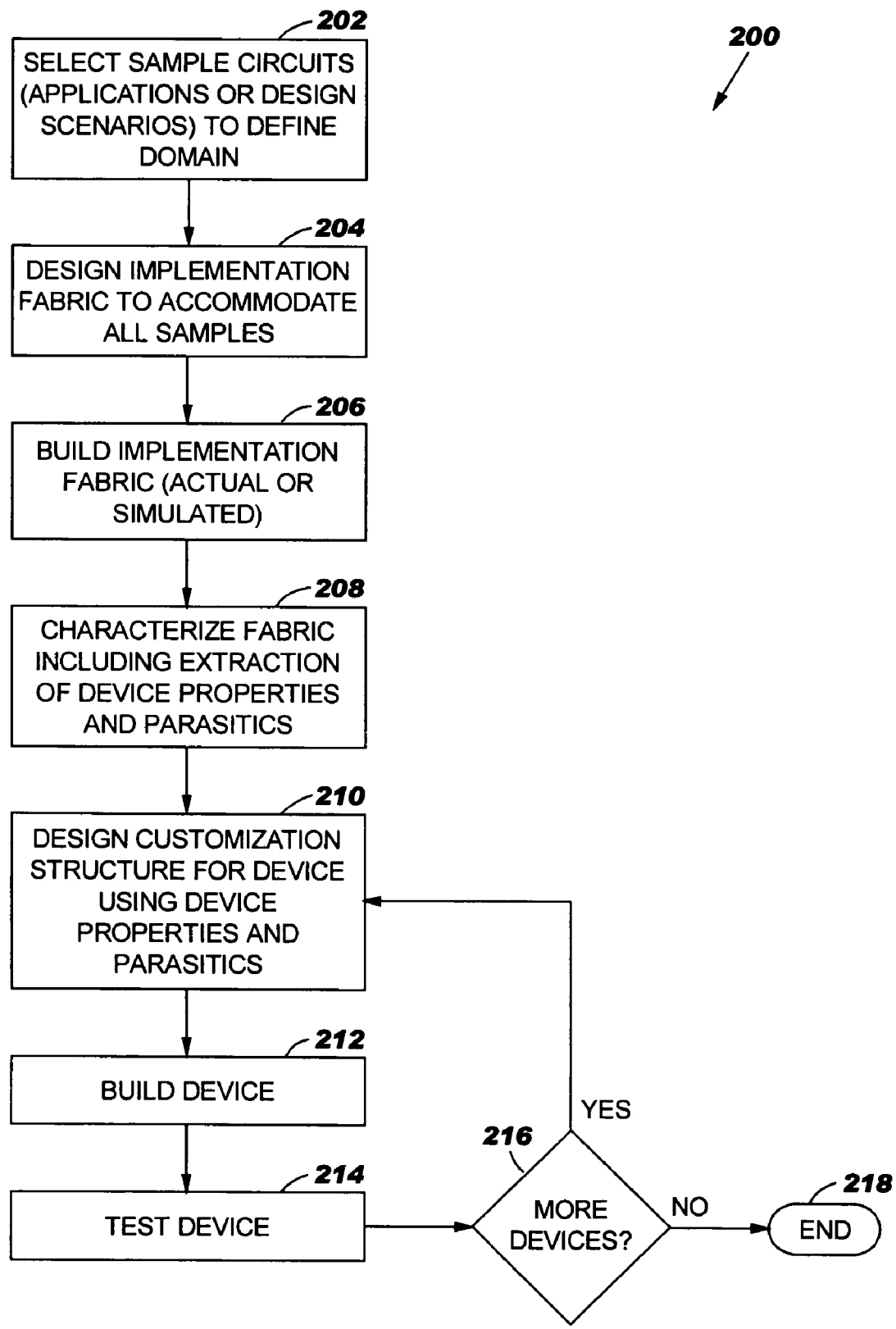

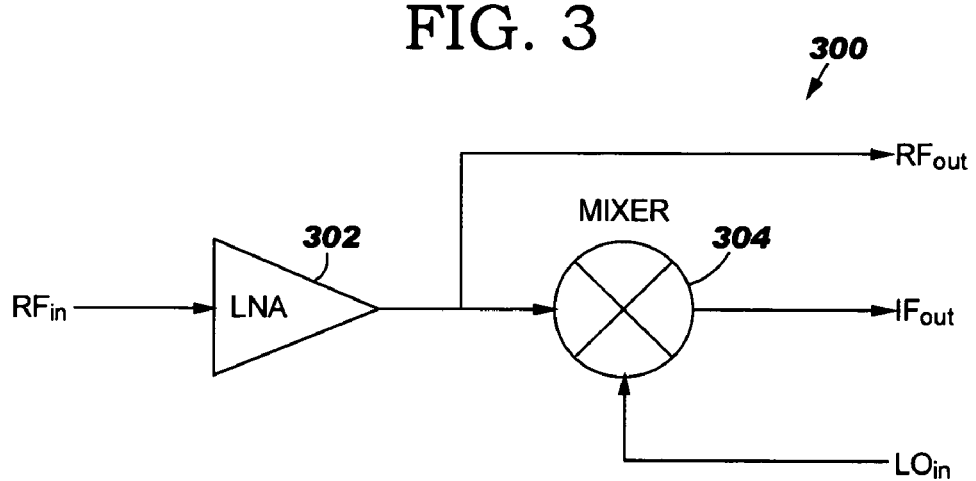
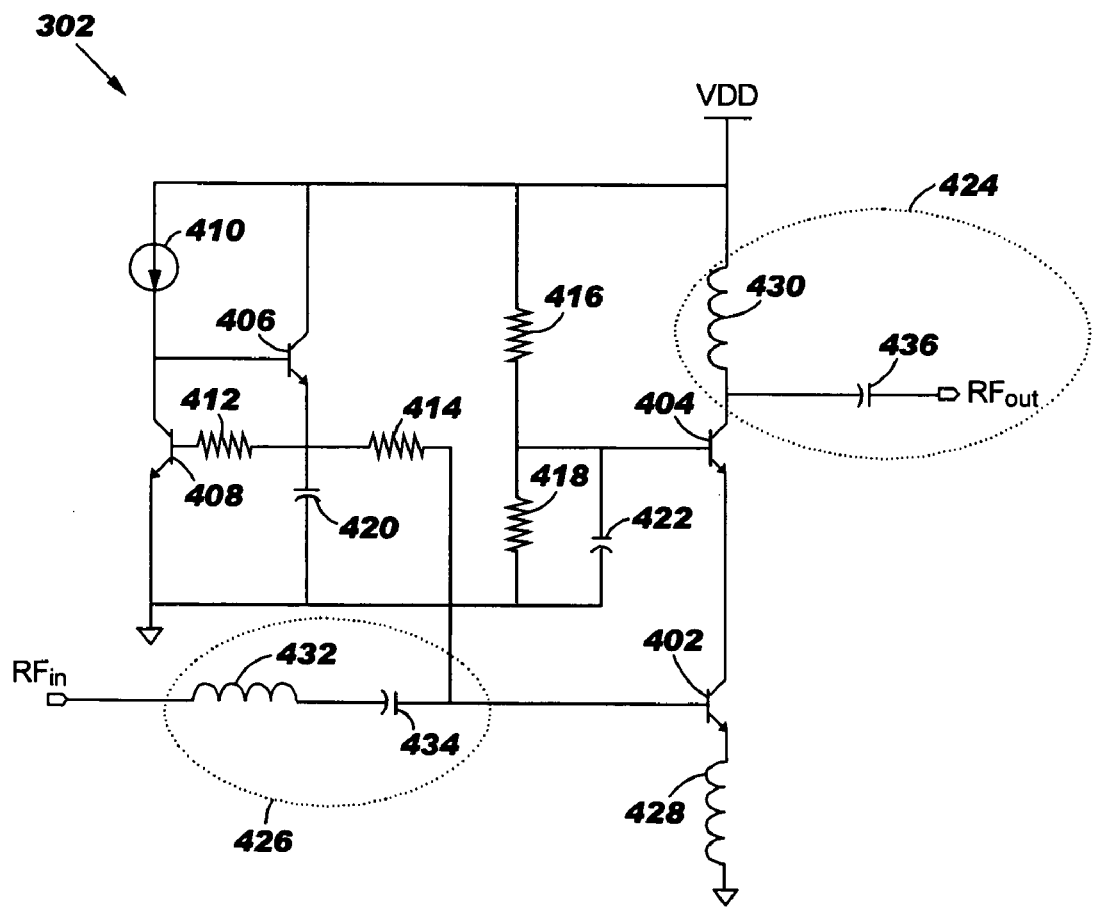

OPTIMIZATION AND DESIGN METHOD FOR CONFIGURABLE ANALOG CIRCUITS AND DEVICES

CROSS-REFERENCE TO RELATED APPLICATION

This application claims priority from co-pending, provisional patent application Ser. No. 60/577,360, filed Jun. 4, 2004 by the inventors hereof, the entire disclosure of which is incorporated herein by reference.

BACKGROUND

The proliferation of wireless communication systems, such as automotive, radar, personal communication systems, and high-bit-rate wireless local area networks, continues to stimulate the demand for radio frequency (RF) and other analog integrated circuits offering low cost, high performance, and reduced development times. Design reuse via configurable circuits has addressed some of these challenges by providing reconfigurable analog circuits for multi-standard communication systems. However, only limited configurability has been achieved because with analog, and especially RF circuits, post-layout reality is hard to predict. This predictability problem is especially acute for mixed signal integrated circuits that are designed in sub-100 nanometer technologies. In this and other cases, large process parameter variability and the complex nature of parasitic coupling can cause high design risk and high cost even with the best synthesis tools and approaches. So-called "standard cell" designs can be developed over time to understand and hopefully reduce the impact of parasitics and non-ideal behavior of devices and switches caused by subtle device property variations, but the versatility of such circuits depends on exactly what devices are included in the standard cell.

SUMMARY

The present invention in example embodiments can provide configurable analog and/or RF front end circuits that can be used in any integrated circuit technology wherein predictable performance can be achieved at the design stage, minimizing performance degradation and rework. Embodiments of the invention make use of an implementation fabric that is accurately pre-characterized in terms of devices and parasitics. A multi-stage optimization design process is used in which the implementation fabric is designed and optimized, while having its device properties and parasitics extracted, and then customization structures are designed and characterized for a particular application. In some embodiments, characterization is accomplished by formulating a configurable design problem as an optimization with recourse problem.

In at least some embodiments, a design process begins with the selection of a plurality of representative design scenarios corresponding to an application domain. An optimized implementation fabric is created to accommodate at least some of the representative design scenarios. The implementation fabric is characterized by extracting device properties and parasitic data for the implementation fabric. Finally, an optimized customization structure, such as one or more mask-configured metal layers, is designed to be connected to the optimized implementation fabric to complete each circuit design. The customization structure is optimized to take into account the device property and parasitic data for the implementation fabric. In the example case of metal mask configurable devices, a design for optimized masks for all of the desired circuits to be implemented in the selected application domain can be completed in this fashion, and circuits according to the various circuit designs can be built and tested.

In some embodiments, the creation of the optimized implementation fabric includes optimizing all of the representative design scenarios for shared design variables and the completion of the optimized design with the optimized customization structure includes optimizing for application-specific design variables as well. In some embodiments, optimization includes the use of posynomial device models for design specifications to obtain at least one design constraint in each case. Design constraints are then combined with the scenario specific and shared design variables to formulate a geometric programming with recourse "GPR" problem. The GPR problem is then solved to optimize the designs. The optimization process can be repeated so that optimization involves multiple stages.

In some embodiments, a GPR problem is solved by dividing it into a plurality of sub-problems and producing a primal dual interior point solution for each of the plurality of sub-problems. A mixed integer solution can then be output for the GPR problem. Some embodiments make use of a convex formulation of the GPR problem. With at least some embodiments, the various optimization steps can be performed partially or completely on a processing platform such as workstation or other computer system, or manually.

Device properties and parasitics can be extracted either by measurement and recordation in a laboratory, or through the use of simulation tools. Where instruction execution or processing platforms are used, these platforms in conjunction with computer program instructions can form the means to carry out at least some portions of the processes of the invention. The result is semiconductor devices which include an implementation fabric that has been optimized for a plurality of representative design scenarios from an application domain. Each device has at least one customization structure connected to the implementation fabric to impart customization to the device for a specific application or circuit design from the application domain. Since the customization structure has been optimized to take into account extracted device properties and parasitics for the implementation fabric, devices produced in this fashion will often achieve good, predictable, performance with little or no rework or redesign. A customization can include mask-produced metal layers, arrays of devices or switches, or any other structure that can impart customization to a common fabric, including structures added after a device is manufactured.

BRIEF DESCRIPTION OF DRAWINGS

FIG. 1 also shows the structure of a semiconductor device according to some embodiments of the invention.

FIG. 2 is a flow chart which illustrates a method according to some embodiments of the invention.

FIG. 3 is a circuit block diagram which illustrates an example circuit topology that has been optimized according to some embodiments of the invention.

FIG. 4 is a schematic diagram illustrating a portion of the circuit which is shown in the block diagram of FIG. 3.

DETAILED DESCRIPTION OF EMBODIMENTS

Figure 1:
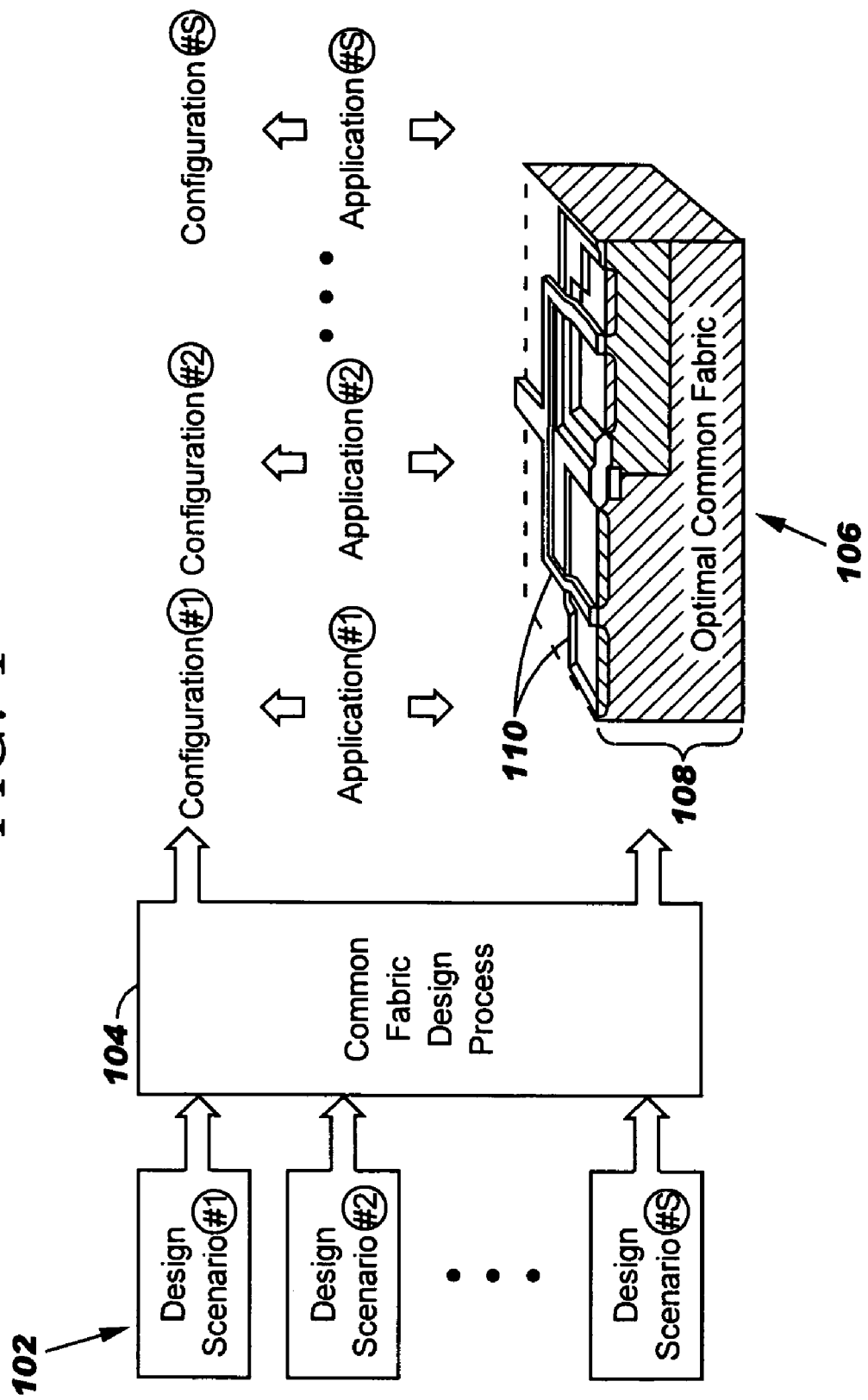
FIG. 1 is a process block diagram which illustrates the process according to some embodiments of the invention.

The present invention will now be described in terms of specific, example embodiments. It is to be understood that the invention is not limited to the example embodiments disclosed. It should also be understood that not every feature of the devices or sub-process of the methods described are necessary to implement the invention as claimed in any particular one of the appended claims. Various elements, steps, processes, and features of various embodiments of devices and processes are described in order to fully enable the invention. It should also be understood that throughout this disclosure, where a process or method is shown or described, the steps of the method may be performed in any order or simultaneously, unless it is clear from the context that one step depends on another being performed first.

It should also be pointed out that references may be made throughout this disclosure to figures and descriptions using terms such as top, above, beneath, within, on, at, and other terms which imply a relative position of a structure or portion. These terms are used merely for convenience and refer only to the relative position of features as shown from the perspective of the reader. An element that is placed or disposed atop another element in the context of this disclosure can be functionally in the same place in an actual product but be beside or below the other element relative to an observer due to the orientation of a device or equipment. Likewise, the numbering of layers of a device are also meant in relative terms. Any discussions which use these terms are meant to encompass various possibilities for orientation and placement.

It may be helpful for the reader to understand certain terms from this point forward. Throughout this disclosure, there is discussion of "circuit designs" or "designs" as well as a discussion of "optimization" with reference to using various iterative and/or mathematical methods to impart predictability and improved performance to the designs. The term "circuit design" is used in its normal sense. The term "design scenario" is used in reference to a definition of a specific circuit design as is used in the optimization process. The term "design specification" refers to the technical specification of a circuit design. An "application domain" is a set of applications that share common characteristics, such that any circuit which can be considered part of the set could be implemented on the same common implementation fabric taking practical considerations into account. With reference to various optimization techniques discussed herein, the term "shared variable" or "shared design variable" refers to variables which relate to the structure dictated by the common implementation fabric. Terms such as "unique variables" and "application specific variables" refer to those variables which relate more to a specific design from within the application domain. Such a specific design can also be referred to as a specific "configuration" or a circuit which is targeted at a specific application. The meaning of other terms are as is generally known in the art, or can be garnered from their context within this disclosure.

A customization structure is any circuitry, connection or switching arrangement, device array, etc. that can impart customization to the fabric. The example of a metal mask customization structure is used at many points throughout this disclosure, but it cannot be overemphasized that this type of structure is an example only. Other examples are transistors, and nanotechnology mechanical or electromechanical devices such as switches. As previously stated, the customization structure can even be something that is added after the implementation fabric is manufactured into a device.

FIG. 1 is a conceptual block diagram which shows a process according to embodiments of the invention, and how that process can be used to produce an optimized device, or a plurality of optimized devices. In FIG. 1, design scenarios and their corresponding applications and configurations are numbered, with their sequence number enclosed in a circle to distinguish it from drawing reference numerals. As shown in FIG. 1, instead of a design flow to optimize a circuit for an individual application, an optimization that supports configurable designs that share common components is used. A "multi-stage" design optimization method results. A plurality of design scenarios, 102, designated design scenario number 1 through design scenario number S are selected from an application domain. An implementation fabric that can be configured for multiple designs is designed at block 104. The design of the implementation fabric includes extracting device properties and parasitics. This data is then used to optimize the various configurations that correspond to the design scenarios. Circuits for individual applications, designated application number 1 through application number S, that correspond to the design scenarios can then be created using custom configurations. These configurations are designated configuration number 1 through configuration number S.

Such a process, whereby configuration is accomplished using a structure that imparts customization to a device can be referred to as back-end-of-line (BEOL) customization. This process allows shared common components to be well characterized via simulation or measurement before the common implementation fabric is designed for multiple applications. This characterization provides predictability that is required for robust, low-risk integrated circuit design. Of course, circuit components should be chosen to be compatible with the proposed customization technique, for example, to be compatible with metal mask configurability.

A portion of an example semiconductor device, 106, resulting from the process of FIG. 1 is also illustrated in FIG. 1. Implementation fabric 108 includes an optimal common structure that has been optimized for the plurality of representative design scenarios from the chosen application domain. A customization structure consisting of mask-produced metal layers 110 is disposed on the implementation fabric and imparts customization to semiconductor device 106 for specific applications. The design of the metal layers has been optimized to take into account device properties and parasitics for implementation fabric 108.

FIG. 2 illustrates a design process, 200, according to example embodiments of the invention, in flowchart form. As is typical with flowchart illustrations, the process 200 is illustrated as a series of process blocks. At block 202, sample circuits, which correspond to applications or design scenarios, are selected in order to define an application domain. It should be understood that an application domain could be selected first. As a practical matter, the selection of sample circuits and the definition of the application domain are intertwined. At block 204, an implementation fabric is designed to accommodate all the sample circuits. At block 206, the implementation fabric is built so that it can be characterized. In some embodiments, the implementation fabric is physically constructed so that characterization can be accomplished in the laboratory. However, in other embodiments, the implementation fabric can be constructed via simulation tools and characterization accomplished in software.

At block 208 of FIG. 4, the implementation fabric is characterized so that data representing device properties and parasitics can be extracted for use in optimizing the circuit designs. Again, this extraction of parasitic and device data can be via laboratory measurement, simulation analysis, or a combination of the two. The remainder of the process blocks apply to each, desired circuit design. They can be carried out in parallel for the various designs, one at a time, or, a single device can be completed and the implementation fabric design can be retained for future use in completing further circuit designs as they are needed.

At block 210 a customization design is completed for a device corresponding to a sample circuit design for a specific application. The design of a customization structure is completed taking into account device property and parasitic data for the implementation fabric. At block 212 the device is constructed, and at block 214 the device is tested. Optionally, at block 216, this process is repeated for each of the desired circuits, which use the same common implementation fabric. Once there are no more devices to design at block 216, the process ends at block 218.

Figure 5:
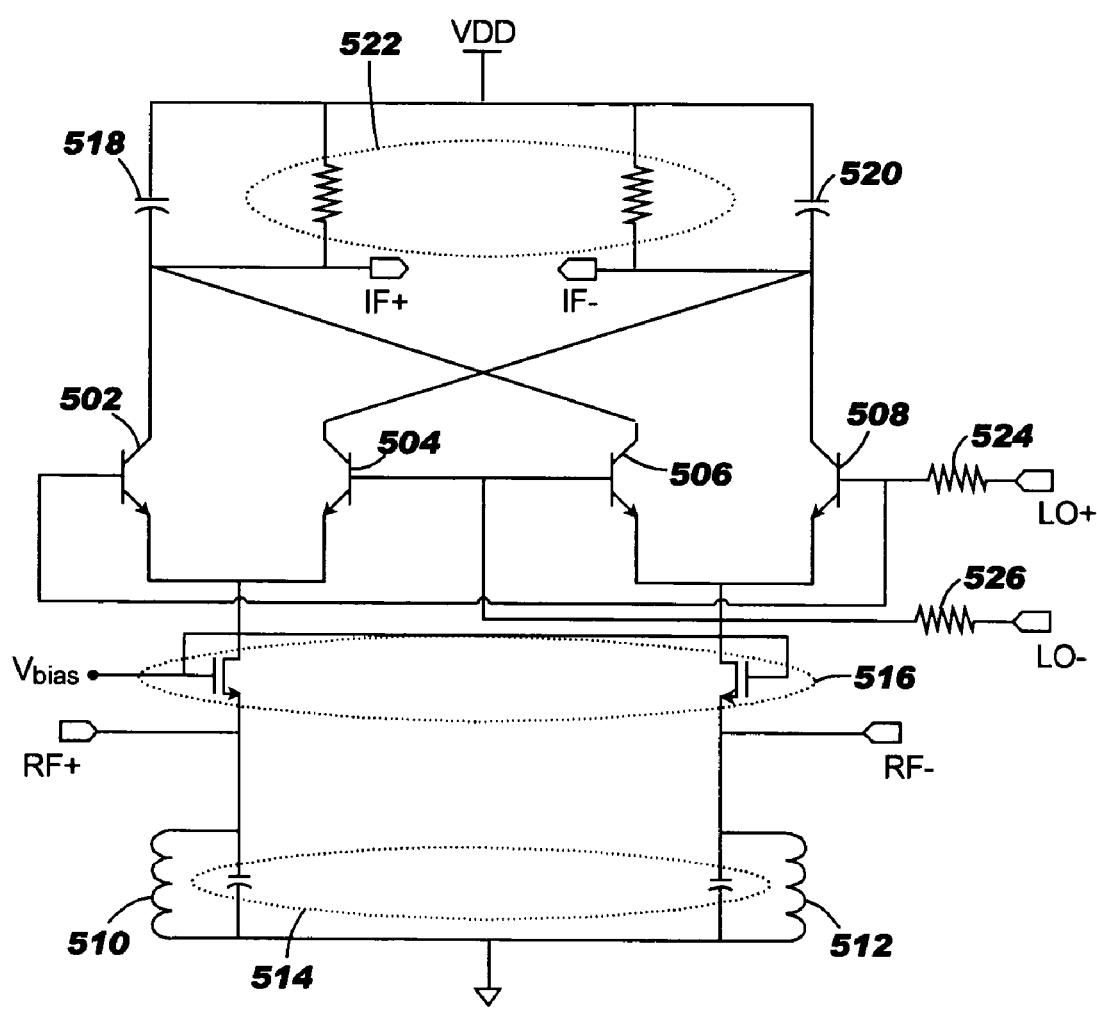
FIG. 5 is another schematic diagram which illustrates another portion of the circuit illustrated in the block diagram of FIG. 3.

FIGS. 3, 4 and 5 illustrate schematic and block diagrams of an example circuit architecture with which the present invention can be used. It cannot be over-emphasized that these figures present example circuits only, and one of ordinary skill in the art could apply the processes of embodiments of the invention to various types of circuits with differing topologies and components. For purposes of this illustration, it can be assumed that metal mask configuration is being used for customization. The example implementation fabric used for the circuits illustrated in the figures includes spiral inductors, metal-insulator-metal (MIM) capacitors, resistors, and two types of transistors, BJT devices and MOSFET devices. The circuits are typical of what might find use in an RF device such as can be used for wireless local area networks. The table below illustrates a proposed, example design specification, with the various customization layers for each type of device being listed. Metal layers are designated with the letter "M, " and via layers are designated with the letter "V."

In this example, a polysilicon patterned ground shield is used for inductor implementation. Those of skill in the art will appreciate that the parasitics characterized for such a circuit largely result from the various junction capacitances of the transistors.

FIG. 3 presents a block diagram of the example circuit, 300. Low noise amplifier (LNA) 302 receives the RF input and provides the RF output. Mixer 304 receives the RF output and a local oscillator (LO) input. Mixer 304 produces an intermediate frequency (IF) output.

A schematic diagram for LNA 302 is illustrated in FIG. 4. LNA 302 uses BJT devices. Transistors 402 and 404 are used in the output stage. Transistors 406 and 408 are used in the input stage. The LNA employs a cascode, common-emitter inductor degenerated topology to provide good noise performance. The current density of the input common-emitter unit transistor is designed to achieve minimum noise. The number of equivalent geometry unit transistors is chosen to match a 50 ohm source impedance. Current source 410 represents the bias current. Resistors 412, 414, 416, 418, and capacitors 420 and 422, are configuration independent. However, mask configuration is used to tune inductor and capacitor combination 424 to match the output. Likewise, inductor and capacitor combination 426 and inductor 428 are tuned to match the input at designated frequencies. The same polysilicon patterned ground shield is used to implement all inductors.

FIG. 5 is a schematic diagram of mixer 304 from FIG. 3. The schematic of FIG. 5 shows a modification of a traditional double balanced Gilbert cell mixer to accommodate BEOL mask configurability. A common gate configuration of BJT devices 502, 504, 506, and 508 is used for the input stage. Tank circuits are used in place of current sources to provide voltage headroom. The tank circuits consist of configuration independent inductors 510 and 512 and tunable capacitors 514 which are configured with the metal mask by changing the capacitance values. MOSFET transistors 515 can be altered to adjust the input impedance. Gain tunable RC filters are provided by configuration independent capacitors 518 and 520, together with resistor array 522, the resistance values of which can be changed through the metal mask configuration layer. The configurability of transistors 516 is actually achieved by altering the number of input transistors switched into the circuit by the metal mask, which is necessary to match the LNA and the mixer when they do not have an exact impedance match. Configuration gain is selected by changing the number of load resistors. Note that there are plus and minus RF inputs and plus and minus local oscillator inputs, the later being supplied through fixed resistors 524 and 526.

Figure 6:
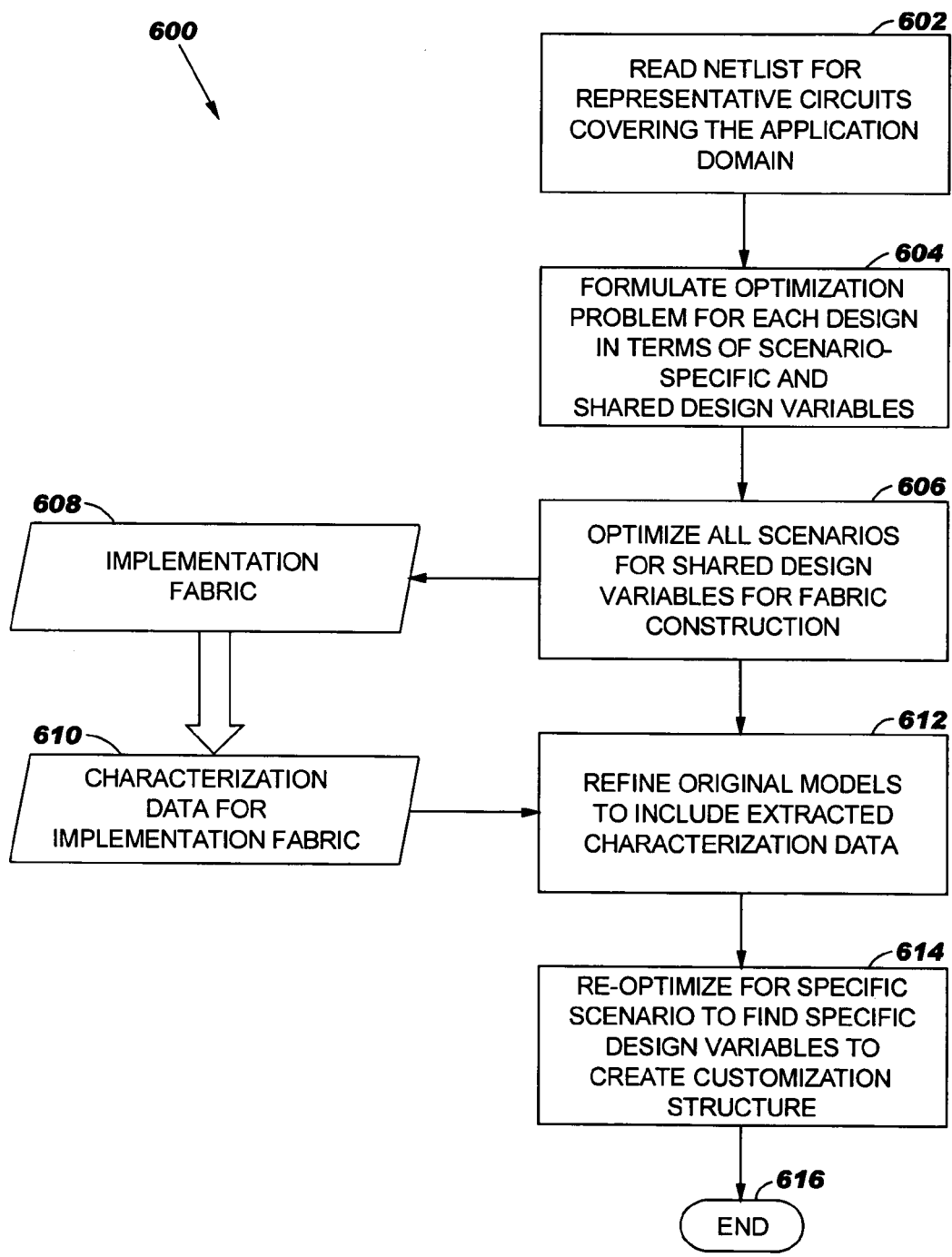
FIG. 6 is a flow chart which illustrates further detail of a method according to some embodiments of the invention.

FIG. 6 is another flowchart style diagram, this time illustrating further detail of a two-stage optimization design process, 600, according to embodiments of the invention.

| RF circuit components | Common layers | Custom layers | Customization unit |
|---|---|---|---|
| Spiral inductors | PolyGround Shield | M6 | Quarter (0.25) turns |
| MIM-Capacitors | Deep trench perimeter | M5, M6, V56 | Unit cap and number of units |
| Resistor | S/D implant or polysilicon | M4, V34, V23, V12 | Number of Unit Resistor |
| SiGeGJT | BJT unit devices | M4, V34, V23, V12 | Number of unit BJT |
| MOS FET | MOSFET unit devices | M4, V34, V23, V12 | Number of unit MOSFET |

This two-stage illustration is an example only, as a multi-stage optimization according to embodiments of the invention can include any number of stages. For convenience, this process may be referred to as the "ORACLE" process. ORACLE is an acronym for Optimization with Recourse of Analog Circuits including Layout Extraction. The top portion of the flowchart of FIG. 6 represents the first stage of the two-stage optimization, while the bottom portion of the flowchart of FIG. 6 represents the second stage of the two-stage optimization. For purposes of this discussion, it can be assumed that at least some of the optimization process is being conducted using computerized means. As previously mentioned, it is possible to perform the optimization manually, or with a combination of manual and computerized.

At block 602 of FIG. 6, the netlist for representative circuits covering the application domain are read and stored. At block 604, an optimization problem is formulated for each design in terms of both scenario specific and shared design variables. At block 606, all scenarios are optimized for shared design variables to produce a fabric design. The resulting output is the implementation fabric as shown at block 608. The implementation fabric is then characterized. This characterization in the example embodiments involves determining parasitics and device properties. As previously mentioned, in some embodiments this characterization is accomplished through laboratory measurements, although a computer simulation can also be used. In any case, the characterization data for the implementation fabric becomes the input for the second stage optimization as shown at block 610.

The original optimization problem for each design scenario, that is the models for each design scenario used for optimization, is refined at block 612 to include the extracted characterization data for the implementation fabric. At block 614 of FIG. 6, the circuit design for each specific design scenario is re-optimized to find scenario-specific design variables to be used for creation of the customization structure. The optimization process ends at block 616, at which point one or more prototype devices can be built and tested. If additional optimization stages are implemented, the results of optimization 614 can be at least a portion of the input for the following optimization stage. It should be noted that various mathematical formulations and techniques can be used to perform the optimizations referred to in the description of FIG. 6. As one example, a technique for optimization with recourse using geometric programming is now presented. This technique may be referred to herein as geometric programming with recourse (GPR).

As previously discussed, the circuit design problem can be formulated as an optimization problem with recourse. In an N-stage optimization, N variables are chosen. In a two-stage optimization, for example, two variables are chosen, which in conjunction are the design variables for each of S applications, or scenarios, as follows:

$x \in R^q$, and
$z \in R^q$.

The variable x must be chosen before the particular scenario s is known; the variable z, however, is chosen after the value of the scenario random variable is known. z is a function of the scenario random variable s. To describe the choice for z, the values that would be chosen under the different scenarios; i.e. the vectors can be listed as follows:

$z_1, \ldots, z_s \in R^q$

Here $z_3$ is our choice of z when s=3 occurs, and so on. The set of values:

$x \in R^n, z_1, \ldots, z_s \in R^q$ can be called the policy, since it describes what choice to make for x (independent of which scenario occurs), and also, what choice to make for z in each possible scenario. The variable z is called the recourse variable (or second-stage variable), since it provides for taking some action or making a choice after it is known which scenario occurred. In contrast, the choice of x (which can be called the first-stage variable) must be made without any knowledge of the scenario.

The cost function and constraints depend not only on the choice of variables, but also on a discrete random variable: $s \in \{1, \ldots, S\}$, which is interpreted as specifying which of S scenarios occurred. The scenario random variable s has known probability distribution π, with:

$\pi_i = \text{Prob}(s=i), i=1, \ldots, S$.

The cost function is given by:

f: $R^n \times R^q \times \{1, \ldots, S\} \to R$, where f(x, $z_i$, i) gives the cost when the first-stage choice x is made, the second-stage choice $z_i$ is made, and scenario i occurs. As an example, the overall objective to be minimized over all policies can be assumed to be the expected cost:

$Ef(x, z_s, s) = \Sigma_{i=1}^{S} \pi_i f(x, z_i, i)$.

A geometric program (GP) is an optimization problem which can minimize a posynomial cost function subject to a posynomial inequality and monomial equality constraints. It can be reformulated as a convex optimization problem: i.e., a problem of minimizing a convex function subject to convex inequality constraints and linear equality constraints. This special type of convex optimization can be globally solved with great efficiency. Efficient interior-point methods can be used to solve the problem, and there is a complete and useful duality, or sensitivity theory for this type of problem.

Once individual optimization problems are formulated as a GP, optimization with recourse can be reformulated as a geometric programming with recourse problem. For example, suppose that the objective and constraint functions f are posynomial functions of (x, z), for each scenario i=1, . . . , S. In order to find an optimal policy, it is necessary to solve a geometric program with recourse problem of the following form:

minimize $F_0(x, z_1, \ldots, z_s)$
subject to: $F_j(x, z_i) \leq 1, i=1, \ldots, S, j=1, \ldots, m$,
$G_j(x, z_i) \leq 1, i=1, \ldots, S, j=1, \ldots, p$,
$x_i > 0, i=1, \ldots, n$,
$z_i > 0, i=1, \ldots, q$.

where $F_0, \ldots, F_m$ are posynomial functions and $G_1, \ldots, G_p$ are monomial functions.

The new objective is the expected value of the total cost, and the new constraints are the union of all individual design constraints. A two-stage GPR problem can be treated as a much larger GP problem, since for each i, f(x, z, i) can be transformed to be convex in (x, $z_i$), and $\pi_i \geq 0$, therefore linear-fractional functions preserve convexity.

The variables in the problem are x, $z_1, \ldots z_s$, i.e. the policy. The total dimension of the variables is n+Sq compared with n+q as in a one-scenario case. The computational burden of solving the large geometric program equivalent for the original problem can be quite prohibitive, since n+Sq (symmetric, positive, definite) linear equations would need to be solved, however, since posynomial function f is a twice-differentiable function of (x, z) for each scenario i=1, . . . , S, the structure can be exploited to simplify the complexity. This possibility exists because the Hessian of F(x) has the block-arrow form, which can be exploited to compute the Newton step efficiently, providing scalability since the overall complexity grows linearly in S.

Figure 7:
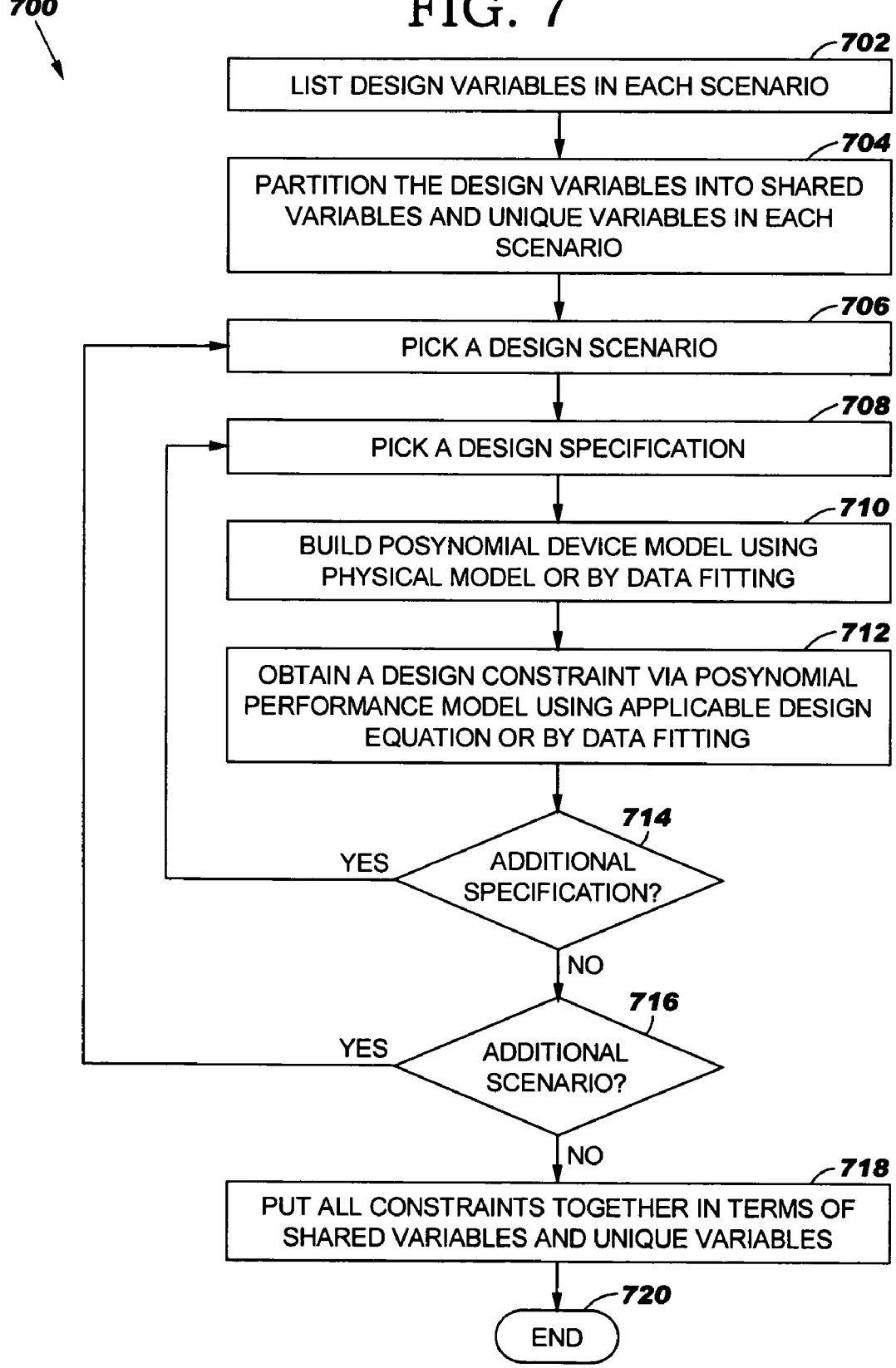
FIG. 7 is an additional flow chart which illustrates still further detail of methods according to some embodiments of the invention.
Figure 8:
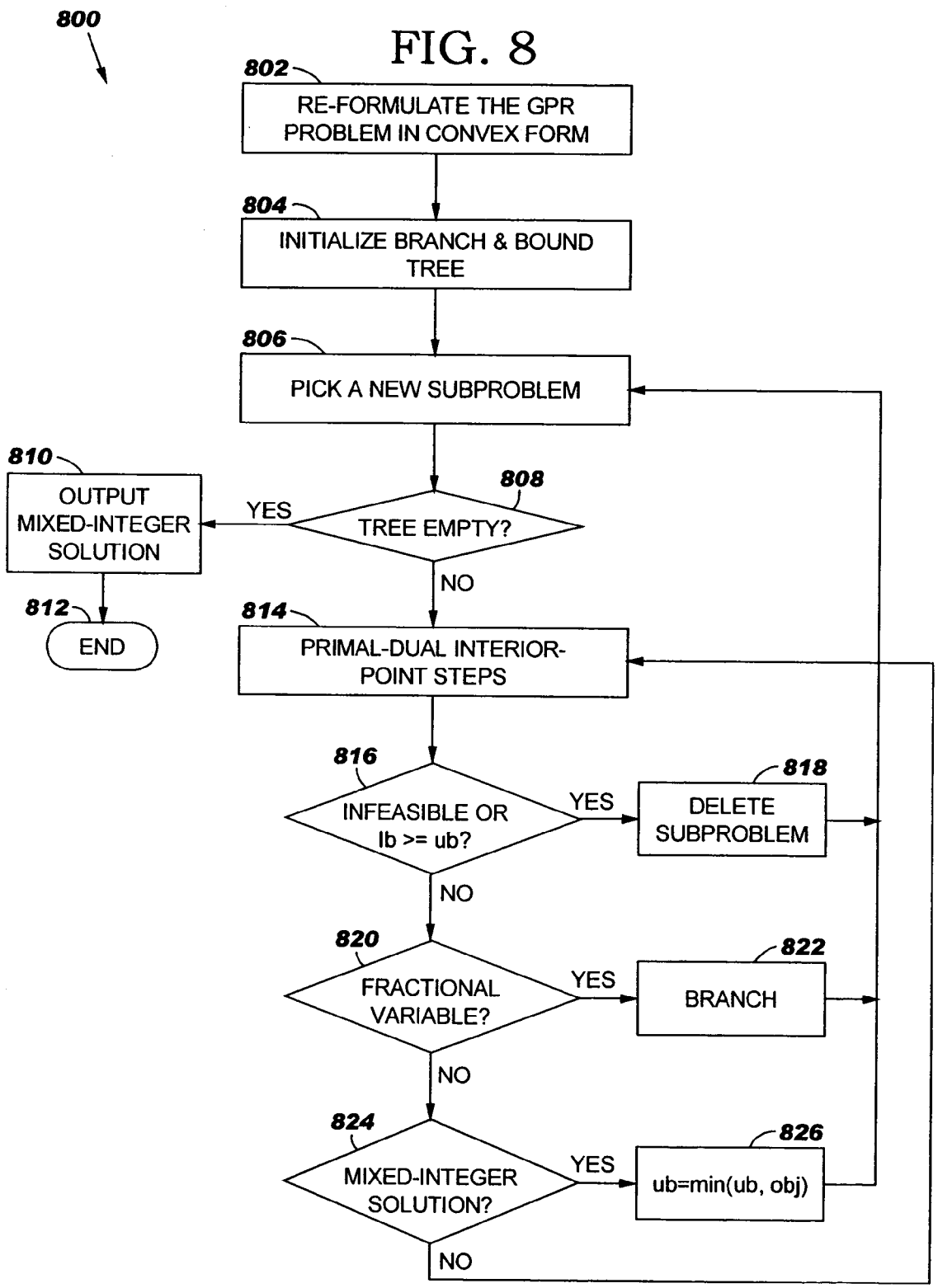
FIG. 8 is yet another flow chart which illustrates still further aspects of methods according to at least some embodiments of the invention.

FIGS. 7 and 8 illustrate, in flowchart form, the use of GPR for the optimization stages in example embodiments for the invention. FIG. 7 illustrates the setup of an optimization problem using GPR, and FIG. 8 illustrates the optimization process itself. Turning to FIG. 7, optimization setup process 700 begins with the listing of design variables in each design scenario at block 702. At block 704, the design variables are partitioned into shared variables and unique variables for each scenario. A design scenario is selected at block 706 and a specification for a circuit design for that scenario is selected at block 708. At block 710, a posynomial device model is built mathematically either using data from a physical device or by data fitting. At block 712 a design constraint is obtained by modeling the performance of the device according to the posynomial device model and taking into account applicable design equations or by using data fitting. By applicable design equations, what is meant is well-known, traditional design equations such as those used to calculate power, voltage, the voltage thresholds of transistors, etc. At block 714, a check is made as to whether there are additional design specifications that could be used for the selected design scenarios. If yes, the process branches back to block 708 and the building of the posynomial device model and the obtaining of the design constraints repeat. If no, a check is made at block 716 for additional design scenarios. If there are additional scenarios, the process branches back to block 706 and another design scenario is selected. Otherwise, constraints are put together with shared variables and unique variables to complete the formulation of the GPR problem at block 718. The problem formulation process 700 of FIG. 7 ends at block 720.

FIG. 8 illustrates a flowchart for a process 800 for solving a GPR problem which has been formulated as described in FIG. 7, according to some example embodiments of the invention. At block 802 the GPR problem is formulated in convex form, and divided into a plurality of subproblems. The formulation is a mixed integer GPR problem, where some of the variables are integer numbers. Each sub-problem assumes all variables are continuous. At block 804, a branch and bound tree algorithm is initialized. This branch and bound tree algorithm, based on the assumption that all variables are continuous, will do an exhaustive search of the integer numbers and the mixed integer GPR problem. A subproblem is selected at block 806. If the branch and bound tree is found to be empty at block 808, it can be assumed that the solution has been reached, and the mixed integer solution is output at block 810. The process then ends at block 812. Alternatively, if the tree is populated at block 808, the GPR problem has not been solved and the process continues.

At block 814, primal dual interior point steps are taken to produce a possible primal dual interior point solution for the current subproblem. At block 816, a check is made as to whether the solution is infeasible. The solution is infeasible if an obtained lower bound (lb) is greater than or equal to the upper bound (ub), which is the objective value for the best known integer solution. If the solution is infeasible, the subproblem is deleted at block 818 and processing returns to block 806 where the next subproblem is selected. If the solution is not infeasible, a check is then made at block 820 to determine if it contains a fractional variable. If so, the branch is completed at block 822, and processing returns to block 806 to pick the next subproblem. If not, a determination is made at block 824 as to whether the proposed solution is a mixed integer solution. If not, processing immediately branches back to block 806. If so, however, the upper bound for that problem is set to be equal to the minimum of the upper bound value or the objective value for that subproblem, at block 826. Again, processing then returns to block 806 for the selection of the next subproblem.

Note that an empty tree signifies that the GPR problem has been solved. In a computer program code implementation of an optimization process according to example embodiments of the invention, a large data structure can be maintained. The data structure includes the tree of subproblems. Each leaf node in the tree is a record containing a description of which variables have been fixed and the best known primal dual solution of that subproblem. When the search algorithm empties the tree, the process is finished and the results are output.

As a more detailed example, the above-described methodology has been applied to an LNA as illustrated in FIGS. 3 and 4. There are 12 independent physical variables in a single design to be optimized. These design variables are related to the sizing and biasing of the input BJT devices and inductors. The cascode transistor 404, the DC biasing circuitry (412, 414, 416, 418, 406, and 408) and decoupling capacitors (420 and 422) are heuristically sized for best matching and power consumption performance.

Referring back to FIG. 4, the 12 independent design variables are divided into two categories: device design variable and metal-mask design variables, which correspond to the front-end and the back-end of the SiGe fabrication processes. The 5 device design variables are: the emitter length and width of input transistor 402, and the outer dimensions of three inductors 428, 430, and 432. These variables are restricted to take values on a discrete grid. Since the layout grid in a modern technology is very small, grid constraints are ignored and considered to be positive real numbers. The 7 metal-mask design variables are: $m_1$ is the number of devices of the same geometry used in parallel for input BJT, which should be an integer number; the number of turns of three inductors, which would be integer multipliers of 0.25 (quarter turns); the value of the input and output tune capacitors 434 and 436, and the collector current, which are considered positive real numbers. The supply voltages and ground, and the various process and technology parameters associated with the SiGe models are assumed to be fixed value. In order to cast the design of LNAs as GP, the LNA design specifications are posed as posynomial functions of the design variables. Being able to write circuit equations in posynomial form allows the use geometric programming to design analog circuits. To achieve equations in posynomial form, one needs to make reasonable approximations, given expected results.

The LNA was designed to achieve simultaneous noise and power match. Under a power consumption constraint, it is desirable to achieve gain with input and output impedance match, while maintaining the minimum noise and distortion level, also minimizing the silicon area. Therefore, when formulating the GP problem, area is minimized subject to the following constraints:

Noise match ($F \leq F_{max}$)
Input impedance match ($S_{11} \leq S_{11}^{max}$)
Gain requirement ($G \geq G_{max}$)
Output impedance match ($S_{22} \leq S_{22}^{max}$)
Nonlinear distortion requirement ($I \geq I_{min}$)
Power constraint ($P \leq P_{max}$)

Where F is the noise figure, $S_{11}$ is the input reflection coefficient, G is the gain, $S_{22}$ is the output reflection coefficient, I is the third-order intercept point (IIP3) and P is the power consumption. The corresponding minimum or maximum are the upper bound or lower bound of each specification.

A Gummel-Poon BJT model can be used to derive the initial design equations, where electrical elements in this model are monomial expressions of physical design variables. A simple monomial fitting technique can be employed to fit the BJT model to achieve better accuracy. For on-chip inductors, all the elements in the lumped electrical model can be expressed as monomial or posynomial function of layout variables. The design parameters considered in the LNA design are the center frequency and source impedance, which is usually 50 ohms in RF systems. Processes like those described above have been used to design amplifier families in which the configuration layers of the mask are used to make devices with varying center frequencies and varying power and gain configurations. Performance substantially similar to completely independent designs can be achieved, albeit, at least in some cases, with a penalty with respect to chip area. Those of skill in the art will appreciate that this penalty results from the area of the implementation fabric being larger than the maximum of all independent designs.

A family of mixers like that shown in FIGS. 4 and 5 can also be provided to work with the LNA. With the mixer circuit, configuration layers are used to set input impedances and the gain tunable RC filters. Configuration layers can also determine how many input transistors are switched into the circuit. The number of load resistors can also be changed. In this way, the LNA and mixer of FIG. 3 can be matched to achieve desired results.

Figure 9:
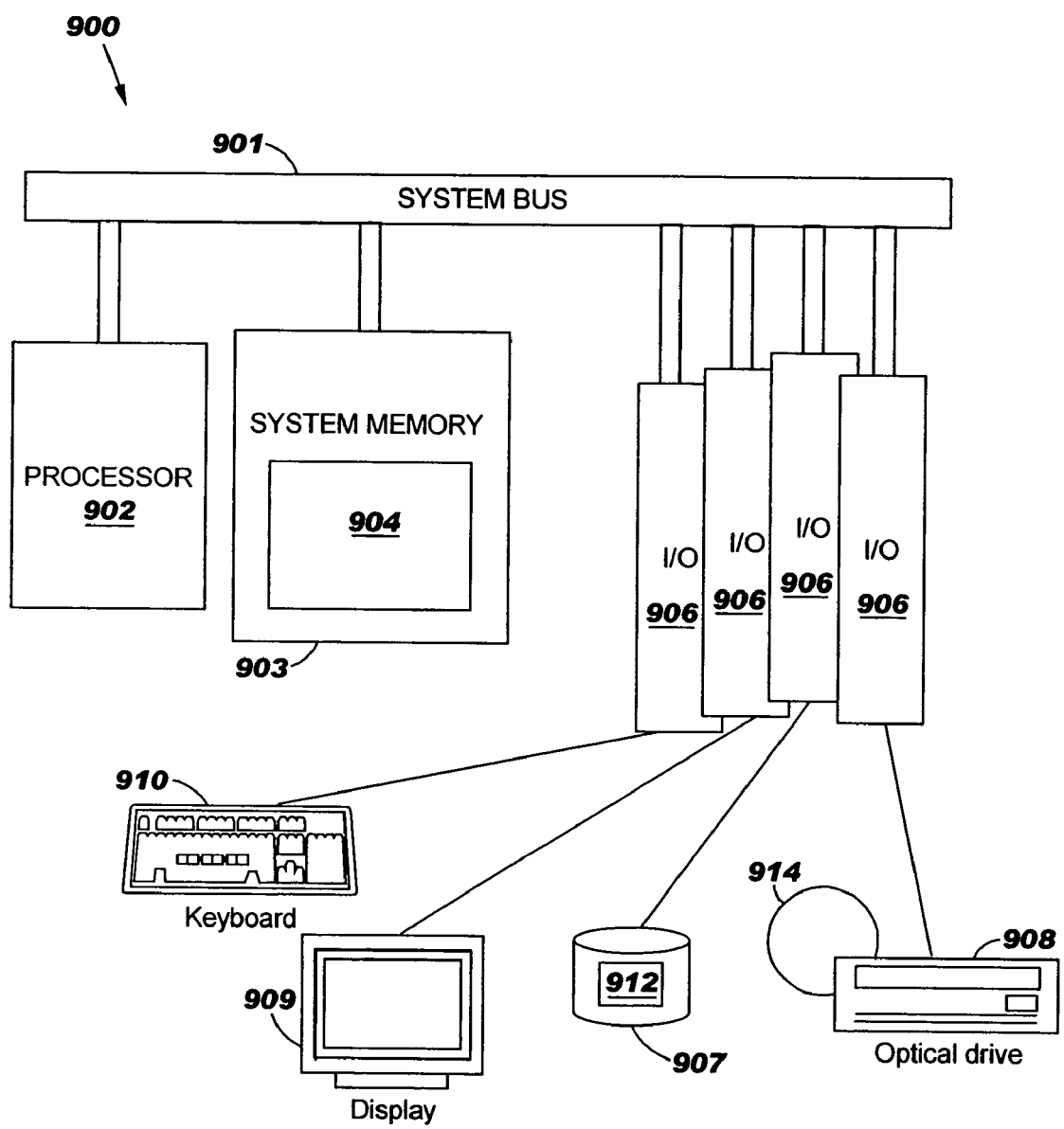
FIG. 9 is a functional block diagram of a processing platform or instruction execution system which can be used in carrying out portions of embodiments of the invention.

As previously discussed, in some embodiments, the invention, or portions thereof, can be implemented through computer program code or computer program instructions operating on a programmable computer system, processing platform, or instruction execution system such as a personal computer or work station. FIG. 9 illustrates further detail of an instruction execution system, 900, that is implementing at least a portion of the invention. System bus 901 interconnects the major components. The system is controlled by processor 902. System memory 903 is typically divided into various regions or types or memory. At least one of those contains some of the computer program code instructions 904 which implement at least portions of the invention. A plurality of input/output (I/O) adapters or devices, 906, are present. These connect to various peripheral devices including fixed, disk drive 907, optical drive 908, display 909, and keyboard 910. One adapter would also typically connect to a network. Computer program code instructions which implement at least some of the functions of the invention can be stored on fixed disk drive 907 as shown by block 912. A computer program product which contains instructions can also be supplied on a media, for example, optical disk 914.

Elements of the invention in fact may be embodied in hardware or software. For example, in addition to taking the form of a computer program product on a medium, the computer program code can be stored in an electronic, magnetic, optical, electromagnetic, infrared, or semiconductor device. Additionally, the computer program may simply be a stream of information being retrieved or downloaded through a network such as the Internet.

Specific embodiments of an invention have been herein described. One of ordinary skill in the semiconductor design arts will quickly recognize that the invention has numerous other embodiments. The following claims are in no way intended to limit the scope of the invention to the specific embodiments described.

The invention claimed is:

1. A method of customizing a configurable analog device, the method comprising:
    selecting a plurality of representative design scenarios corresponding to an application domain;
    creating an optimized implementation fabric by optimizing the plurality of representative design scenarios for shared design variables;
    characterizing the optimized implementation fabric by extracting device property and parasitic data for the implementation fabric; and
    designing an optimized customization structure for the optimized implementation fabric to complete an analog circuit design, taking into account the device property and parasitic data.

2. The method of claim 1 wherein the optimized customization structure is applied to the optimized implementation fabric to configure the configurable analog device based on the circuit design.

3. The method of claim 2 wherein the designing of the optimized customization structure is repeated to produce a plurality of circuit designs using the optimized implementation fabric, so that a plurality of configurable analog devices can be configured.

4. The method of claim 3 wherein
    the designing of the optimized customization structure further comprises optimizing the at least one of the representative design scenarios for application-specific design variables.

5. The method of claim 4 wherein at least one of the optimizing all of the representative design scenarios and the optimizing of the at least one of the representative design scenarios further comprises:
    using a posynomial device model of a design specification to obtain at least one design constraint;
    combining the at least one design constraint with the scenario-specific and the shared design variables to formulate a geometric programming with recourse (GPR) problem; and
    solving the GPR problem.

6. The method of claim 2 wherein
    the designing of the optimized customization structure further comprises optimizing the at least one of the representative design scenarios for application-specific design variables.

7. The method of claim 6 wherein at least one of the optimizing all of the representative design scenarios and the optimizing of the at least one of the representative design scenarios further comprises:
    using a posynomial device model of a design specification to obtain at least one design constraint;
    combining the at least one design constraint with the scenario-specific and the shared design variables to formulate a geometric programming with recourse (GPR) problem; and
    solving the GPR problem.

8. A method of optimizing at least one configurable analog circuit design using a common implementation fabric, the method comprising:
    building a posynomial device model for a design specification for the at least one configurable analog circuit design;
    obtaining at least one design constraint from the posynomial device model;

combining the at least one design constraint with shared variables for the common implementation fabric and unique variables related to the at least one configurable analog circuit design to formulate a geometric programming with recourse (GPR) problem;

solving the GPR problem for the at least one configurable analog circuit design implemented on the common implementation fabric.

9. The method of claim 8 wherein at least one of the building the posynomial device model and the obtaining of the at least one design constraint comprises data fitting.

10. The method of claim 9 wherein the GPR problem is formulated in convex form.

11. The method of claim 9 wherein the solving of the GPR problem further comprises:

dividing the GPR problem into a plurality of subproblems;

producing a primal-dual interior point solution for each of the plurality of subproblems; and outputting a mixed-integer solution for the GPR problem.

12. The method of claim 8 wherein the at least one design constraint is obtained from a design equation.

13. The method of claim 12 wherein the GPR problem is formulated in convex form.

14. The method of claim 13 wherein the solving of the GPR problem further comprises:

dividing the GPR problem into a plurality of subproblems;

producing a primal-dual interior point solution for each of the plurality of subproblems; and outputting a mixed-integer solution for the GPR problem.

15. The method of claim 8 wherein the GPR problem is formulated in convex form.

16. The method of claim 15 wherein the solving of the GPR problem further comprises:

dividing the GPR problem into a plurality of subproblems;

producing a primal-dual interior point solution for each of the plurality of subproblems; and outputting a mixed-integer solution for the GPR problem.

17. The method of claim 8 wherein the solving of the GPR problem further comprises:

dividing the GPR problem into a plurality of subproblems;

producing a primal-dual interior point solution for each of the plurality of subproblems; and outputting a mixed-integer solution for the GPR problem.

18. A computer program product comprising a computer program for enabling the optimizing of a plurality of configurable analog circuit designs using a common implementation fabric, the computer program comprising:

instructions for building a posynomial device model for a design specification for a configurable analog circuit design from among the plurality of configurable analog circuit designs;

instructions for obtaining at least one design constraint from the posynomial device model;

instructions for combining the at least one design constraint with shared variables for the common implementation fabric and unique variables related to the configurable analog circuit design to formulate a geometric programming with recourse (GPR) problem;

instructions for solving the GPR problem for the configurable analog circuit design implemented on the common implementation fabric.

19. The computer program product of claim 18 further comprising instructions for data fitting.

20. The computer program product of claim 19 wherein the GPR problem is formulated in convex form.

21. The computer program product of claim 19 wherein the computer program further comprises:

instructions for dividing the GPR problem into a plurality of subproblems;

instructions for producing a primal-dual interior point solution for each of the plurality of subproblems; and instructions for outputting a mixed-integer solution for the GPR problem.

22. The computer program product of claim 18 wherein the at least one design constraint is obtained from a design equation.

23. The computer program product of claim 22 wherein the GPR problem is formulated in convex form.

24. The computer program product of claim 23 wherein the computer program further comprises:

instructions for dividing the GPR problem into a plurality of subproblems;

instructions for producing a primal-dual interior point solution for each of the plurality of subproblems; and instructions for outputting a mixed-integer solution for the GPR problem.

25. The computer program product of claim 18 wherein the GPR problem is formulated in convex form.

26. The computer program product of claim 25 wherein the computer program further comprises:

instructions for dividing the GPR problem into a plurality of subproblems;

instructions for producing a primal-dual interior point solution for each of the plurality of subproblems; and instructions for outputting a mixed-integer solution for the GPR problem.

27. The computer program product of claim 18 wherein the computer program further comprises:

instructions for dividing the GPR problem into a plurality of subproblems;

instructions for producing a primal-dual interior point solution for each of the plurality of subproblems; and instructions for outputting a mixed-integer solution for the GPR problem.

28. Apparatus for optimizing a plurality of configurable analog circuit designs using a common implementation fabric, the apparatus comprising:

means for building a posynomial device model for a design specification for a configurable analog circuit design;

means for obtaining at least one design constraint from the posynomial device model;

means for combining the at least one design constraint with shared variables for the common implementation fabric and unique variables related to the configurable analog circuit design to formulate a geometric programming with recourse (GPR) problem;

means for solving the GPR problem for the individual configurable analog circuit design implemented on the common implementation fabric.

29. The apparatus of claim 28 further comprising means for formulating the GPR problem in convex form.

30. The apparatus of claim 29 further comprising:
means for dividing the GPR problem into a plurality of subproblems;
means for producing a primal-dual interior point solution for each of the plurality of subproblems; and
means for outputting a mixed-integer solution for the GPR problem.

31. A customized, configurable analog device comprising:
an implementation fabric that has been optimized for a plurality of representative design scenarios from an application domain by optimizing the plurality of representative design scenarios for shared design variables; and
a customization structure connected to the implementation fabric to impart customization to the configurable analog device for a specific application, the customization structure being optimized to take into account extracted device properties and parasitics for the implementation fabric.

32. The semiconductor device of claim 31 wherein at least one of the implementation fabric and the customization structure has been optimized by a method comprising:
using a posynomial device model of a design specification to obtain at least one design constraint;
combining the at least one design constraint with application-specific and shared design variables to formulate a geometric programming with recourse (GPR) problem; and
solving the GPR problem for the semiconductor device.

33. The semiconductor device of claim 32 wherein the method by which at least one of the implementation fabric and the at least one mask-produced metal layer has been optimized further comprises:
dividing the GPR problem into a plurality of subproblems;
producing a primal-dual interior point solution for each of the plurality of subproblems; and
outputting a mixed-integer solution for the GPR problem.

34. The semiconductor device of claim 33 wherein the customization structure further comprises at least one mask-produced metal layer.

35. The semiconductor device of claim 32 wherein the customization structure further comprises at least one mask-produced metal layer.

36. The semiconductor device of claim 31 wherein the customization structure further comprises at least one mask-produced metal layer.

* * * * *

UNITED STATES PATENT AND TRADEMARK OFFICE
CERTIFICATE OF CORRECTION

| | | |
|---|---|---|
| PATENT NO. | : 7,350,164 B2 | Page 1 of 1 |
| APPLICATION NO. | : 10/978497 | |
| DATED | : March 25, 2008 | |
| INVENTOR(S) | : Yang Xu et al. | |

It is certified that error appears in the above-identified patent and that said Letters Patent is hereby corrected as shown below:

- Title page of Letters Patent item 75 - please correct the state of inventor Stephen P. Boyd from "PA" to "CA";

Signed and Sealed this

Twentieth Day of October, 2009

David J. Kappos
*Director of the United States Patent and Trademark Office*